United States Patent
Pommer et al.

(10) Patent No.: US 9,465,176 B2
(45) Date of Patent: Oct. 11, 2016

(54) SMALL FORM FACTOR TRANSCEIVER COMPATIBLE WITH SOLDER PROCESSING

(71) Applicant: ULTRA COMMUNICATIONS, INC., Vista, CA (US)

(72) Inventors: Richard J. Pommer, Carlsbad, CA (US); Joseph F. Ahadian, San Marcos, CA (US); Charles B. Kuznia, Encinitas, CA (US); Richard T. Hagan, Mission Viejo, CA (US)

(73) Assignee: ULTRA COMMUNICATIONS, INC., Vista, CA (US)

( * ) Notice: Subject to any disclaimer, the term of this patent is extended or adjusted under 35 U.S.C. 154(b) by 188 days.

(21) Appl. No.: 14/391,701

(22) PCT Filed: Apr. 11, 2013

(86) PCT No.: PCT/US2013/036115
§ 371 (c)(1),
(2) Date: Oct. 9, 2014

(87) PCT Pub. No.: WO2013/155263
PCT Pub. Date: Oct. 17, 2013

(65) Prior Publication Data
US 2015/0063760 A1 Mar. 5, 2015

Related U.S. Application Data

(60) Provisional application No. 61/623,056, filed on Apr. 11, 2012.

(51) Int. Cl.
*G02B 6/42* (2006.01)

(52) U.S. Cl.
CPC .......... *G02B 6/4251* (2013.01); *G02B 6/425* (2013.01); *G02B 6/428* (2013.01); *G02B 6/4214* (2013.01); *G02B 6/4246* (2013.01); *G02B 6/4292* (2013.01); *H01L 2224/48227* (2013.01); *H01L 2224/48472* (2013.01)

(58) Field of Classification Search
None
See application file for complete search history.

(56) References Cited

U.S. PATENT DOCUMENTS 6,901,185 B2 * 5/2005 Sasaki ............... G02B 6/43
385/137
7,539,367 B2 * 5/2009 Tamura ............... G02B 6/4214
385/14

(Continued)

*Primary Examiner* — Michelle R Connelly
(74) *Attorney, Agent, or Firm* — Jonathan A. Kidney; TechLaw LLP

(57) ABSTRACT

A fiber optic transceiver that is compatible with packaging into standard semiconductor packages and for SMT packaging, using materials and fabrication procedures that withstand solder assembly processes. The SMT package can have electrical contacts on the exterior of the package for creating electrical conduits to a substrate, such as a PCB, interposer, or circuit card within a larger assembly. The fiber optic transceiver can be of a non-SMT package configuration, being formed with electrical connection technology that allows direct connection to a substrate with electrical wiring, such as a PCB, interposer, or circuit card within a larger assembly. The fiber optic transceiver may have solderballs, metal posts or other electrical conduit technology that allows direct electrical connection to the substrate.

20 Claims, 14 Drawing Sheets

(56) References Cited

U.S. PATENT DOCUMENTS

| | | | | |
|---|---|---|---|---|
| 8,483,571 B2* | 7/2013 | McColloch | ........... | G02B 6/4206 359/629 |
| 2004/0234210 A1* | 11/2004 | Nagasaka | ............ | G02B 6/4214 385/88 |
| 2005/0175347 A1* | 8/2005 | Ray | ...................... | G02B 6/4214 398/88 |
| 2010/0135618 A1* | 6/2010 | Howard | ................ | G02B 6/3829 385/79 |
| 2011/0216998 A1* | 9/2011 | Symington | ........... | G02B 3/0075 385/14 |
| 2012/0219256 A1* | 8/2012 | McColloch | ........... | G02B 6/4206 385/88 |
| 2013/0209038 A1* | 8/2013 | Pommer | ................. | G02B 6/424 385/76 |

* cited by examiner

- Prior Art -

SMALL FORM FACTOR TRANSCEIVER COMPATIBLE WITH SOLDER PROCESSING

CROSS-REFERENCE TO RELATED APPLICATION(S)

This application claims the benefit of international application no. PCT/US13/036,115 filed Apr. 11, 2013, which claims priority to U.S. Provisional Patent Application No. 61/623,056 filed Apr. 11, 2012, titled "SMALL FORM FACTOR TRANSCEIVER COMPATIBLE WITH SOLDER PROCESSING" the contents of which are hereby incorporated by reference in their entirety.

BACKGROUND

1. Field

The invention relates to the field of fiber optics for optical communications. More specifically it relates to fiber optic modules that can withstand solder reflow assembly.

2. Background

Fiber optic modules combine semiconductor components, such as application specific integrated circuitry (ASIC), diode lasers and diode photodetectors, into a single package. This package has an electrical interface to a higher level assembly (typically a printed circuit board (PCB)) and an optical interface to fibers. The electrical interface can be a connector to make a 'pluggable' module, for example in small form-factor pluggable (SFP). The fiber optical module can be assembled within a cable with an electrical connector, for example in an active optical cable (AOC). This type of packaging protects the fiber optic module from the high temperatures and exposure to post-reflow aqueous wash.

Fiber optic modules provide efficient optical coupling between optoelectronic (OE) devices and fibers. OE devices can be light emitters, such as lasers, and LEDs, and light detectors, such as PIN diodes. This optical coupling can be performed with a component containing lenses and features for aligning the fibers and OE devices to the lenses. This component can be formed by precision molding of plastic. Plastic has a much larger coefficient of thermal expansion than the semiconductor devices.

The process of solder reflow assembly exposes components to a large temperature gradient and a post reflow washing. This high temperature can damage the plastic through deformation or misalign the lenses from the fiber or OE devices. Moisture from the washing process can contaminate the optical path if the path is not sealed.

Therefore, there are several concerns of thermal mismatch as well as contamination of connection from using a fiber optic connector (fiber connector). Accordingly, there has been a long-standing need in the optical community for systems and methods that provide better match/minimize contamination. The following description provides details of various systems and methods that address the above and other concerns in the optical community.

SUMMARY

The following presents a simplified summary in order to provide a basic understanding of some aspects of the claimed subject matter. This summary is not an extensive overview, and is not intended to identify key/critical elements or to delineate the scope of the claimed subject matter. Its purpose is to present some concepts in a simplified form as a prelude to the more detailed description that is presented later.

In one aspect of the disclosed embodiments, a solderable fiber optic transceiver device is provided, comprising: a connector guide, a top portion having an alignment guide hole configured to mate to an alignment pin of an attachable fiber optic connector and an optical port for light passage to/from an optical fiber in the attachable fiber optic connector; a lens seal coupled to a bottom portion of the connector guide; a collimating lens in alignment with the optical port and sealed to a bottom portion of the lens seal to prevent external contamination from gases and liquids; a transparent carrier coupled to a bottom portion of the collimating lens, wherein the transparent carrier has a first electrical wiring, and a second electrical wiring for connection to a higher level substrate; and an optoelectronic device in alignment with the collimating lens and mounted to an underside of the transparent carrier and connected to the first electrical wiring.

In other aspects of some of the disclosed embodiments, the solderable fiber optic transceiver device further comprises: at least one of an electrical circuit and an application specific integrated circuit (ASIC) attached to the second electrical wiring of the transparent carrier; and/or at least one of the transparent carrier and application specific circuit (ASIC) is configured for mounting to a higher level substrate via at least one of a Ball Grid Array (BGA), Column Grid Array (CGA), Bump Chip Carrier (BCC) configuration, Leaded Chip Carrier (LCC) configuration, Plastic Leaded Chip Carrier (PLCC) configuration, Quad-Flat No-Lead (QFN) configuration, flip-chip contact, conductive epoxy, solder ball, wire-bond and metal posts with solder caps; and/or a higher level substrate is connected to at least one of the second electrical wiring and ASIC, wherein the higher level substrate is at least one of a printed circuit board (PCB) and circuit card; and a thermal interface region is between the transparent carrier and the higher level substrate; and/or an interposer, a top portion is connected to the second electrical wiring and a bottom portion having electrical contacts is configured for mounting to a higher level substrate via at least one of a Ball Grid Array (BGA), Column Grid Array (CGA), Bump Chip Carrier (BCC) configuration, Leaded Chip Carrier (LCC) configuration, Plastic Leaded Chip Carrier (PLCC) configuration, Quad-Flat No-Lead (QFN) configuration, Chip Scale Packaging (CSP), flip-chip contact, conductive epoxy, solder ball, wire-bond and metal posts with solder caps; and an interface region is at a bottom portion of the interposer; and/or wherein the higher level substrate is connected to the electrical contacts of the interposer, wherein the higher level substrate is at least one of a printed circuit board (PCB) and circuit card; and/or wherein the optoelectronic device is a laser and is flip-chip mounted to the first electrical wiring of the transparent carrier; and/or wherein at least one of the collimating lens and lens seal have a pocket to contain a bonding material; and/or a fiber optic connector is attached to the connector guide; and/or wherein the fiber optic connector comprises: a connector lens with a corner turn lens to re-direct light from a fiber, fiber mounts, and a strain relief capture cavity; a fiber cable containing a plurality of fibers coupled to the connector lens; a strain relief attached to the plurality of fibers and coupled to the connector lens; and a lens cap with a retention support feature for alignment, the lens cap coupled to the strain relief and connector lens; and/or wherein the fiber optic connector comprises: a connector lens with a corner turn lens to re-direct light from a fiber, fiber mounts, and a strain relief capture cavity; a fiber cable containing a plurality of fibers coupled to the connector lens; a strain relief attached to the plurality of fibers and coupled to the connector lens; and a lens cap with a retention support feature for alignment, the lens cap coupled to the strain relief and connector lens; and/or wherein a bottom portion of the connector lens further comprises a slip joint alignment feature configured to assist in alignment with the connector guide and an optical gasket coupled to the bottom portion of the connector lens; and/or a connector retention is coupled to the retention support feature and to a connector retention mount, wherein the connector retention mount is integral to a higher level substrate or coupled to a support frame of the higher level substrate.

In another aspect of the disclosed embodiments, a method for fabricating a solderable optical transceiver device is provided, comprising: at least one of a wafer and flip-chip bonding a connector guide to a lens seal; at least one of a wafer and flip-chip bonding the lens seal to a collimating lens; at least one of a wafer and flip-chip bonding the collimating lens to a top side of a transparent substrate; at least one of a wafer and flip-chip bonding an optoelectronic device to a bottom side of the transparent substrate; populating a substrate with at least one of a passive electrical component, lead frame interconnect and a mechanical structure for supporting a lid; at least one of wire-bonding, ribbon-bonding, and flip-chip attaching an optical Core to the substrate; and sealing the device with at least one of a protective cover and optically transparent sealing compound.

In other aspects of some of the disclosed embodiments, the method further comprises dicing out the bonded connector guide, lens seal, collimating lens, and transparent substrate; and/or mounting the device to a higher level substrate via at least one of a Ball Grid Array (BGA), Column Grid Array (CGA), Bump Chip Carrier (BCC) configuration, Leaded Chip Carrier (LCC) configuration, Plastic Leaded Chip Carrier (PLCC) configuration, Quad-Flat No-Lead (QFN) configuration, flip-chip contact, conductive epoxy, solder ball, wire-bond and metal posts with solder caps; and/or mounting the device to an interposer having electrical contacts configured for mounting to a higher level substrate via at least one of a Ball Grid Array (BGA), Column Grid Array (CGA), Bump Chip Carrier (BCC) configuration, Leaded Chip Carrier (LCC) configuration, Plastic Leaded Chip Carrier (PLCC) configuration, Quad-Flat No-Lead (QFN) configuration, Chip Scale Packaging (CSP), flip-chip contact, conductive epoxy, solder ball, wire-bond and metal posts with solder caps; and/or attaching a fiber connector to the connector guide; and/or attaching a connector retention to a retention support feature on the fiber connector and to a connector retention mount, wherein the connector retention mount is integral to a higher level substrate or coupled to a support frame of the higher level substrate; and/or wherein the bonding process for the collimating lens to the top side of a transparent substrate includes forming registration marks to permit alignment of the optoelectronic device when bonded to the bottom side of the transparent substrate.

DETAILED DESCRIPTION

Figure 1:
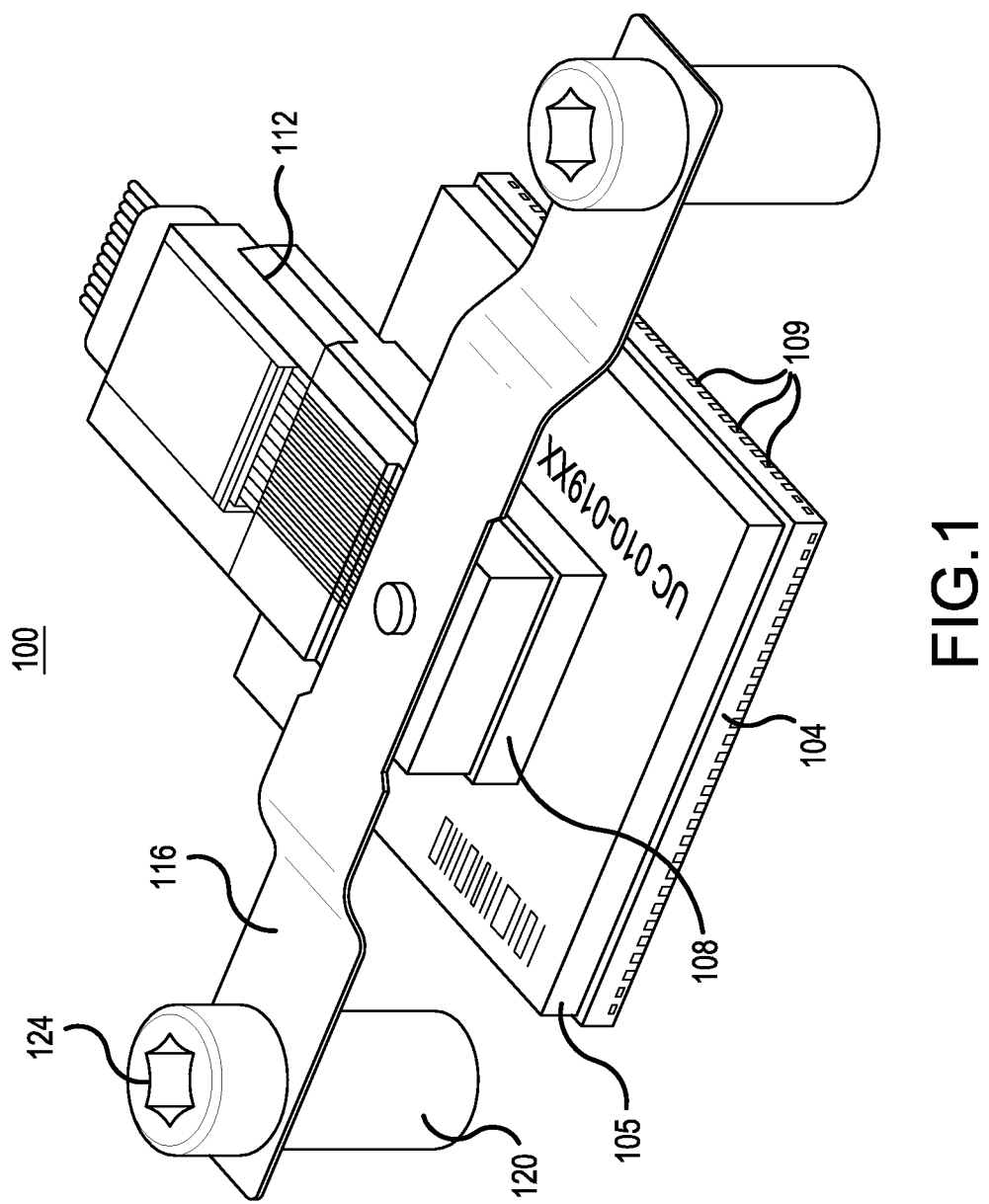
FIG. 1 is a perspective view of an embodiment of a fiber optic transceiver assembly formed with an optical transceiver, protective cover, solderable package, and fiber optic connector.

A fiber connector allows the fiber to be removed during packaging of the fiber optic module. The contents of U.S. Pat. No. 7,543,994 B2, issued Jun. 9, 2009 to McColloch, titled "Multi-optical Fiber Connector Module for use with a Transceiver Module and Method for Coupling Optical Signals between the Transceiver Module and Multiple Optical Fibers," is incorporated by reference in its entirety and describes a fiber connector with collimated light interface between the connector and the OE devices. The fiber connector incorporates lenses on a corner turn surface to create multiple collimated beams from multiple fibers. A lens system is incorporated into the active portion of the fiber optic module (the 'transceiver'). This lens system creates multiple collimated beams from OE devices. This collimated optical interface provides robust coupling between the fibers and OE devices due to its relative insensitivity to lateral and vertical misalignment.

A fiber optic module that cannot be assembled to a PCB in a standard reflow process (without the electrical connector) has several disadvantages: 1) a connector needs to be incorporated on both the PCB and fiber optic module, adding cost to both assemblies, 2) for high data rates the connector must be manufactured with precision to preserve a high-fidelity electrical path, 3) connectors can add significantly to the overall sizes (lateral and vertical) of the fiber optic module, due to mechanical mounting and retention/release mechanisms.

Separately, the semiconductor industry has developed several types of surface mount technology (SMT) packages for ASICs. SMT packages have reduced electrical parasitic (compared to 'thru-hole' packages) and are better suited for high speed operation. There are many types of SMT packages, a non-limiting list being: Ball Grid Array (BGA), Column Grid Array (CGA), Bump Chip Carrier (BCC), Leaded Chip Carrier (LCC), Plastic Leaded Chip Carrier (PLCC), and Quad-Flat No-leads (QFN).

Many of these packages also provide heat transfer with metal vias or a metal pad under the ASIC, creating a thermal pad. These packages offers variety of benefits including reduced lead inductance, a small sized "near chip scale" footprint, thin profile and low weight.

Chip scale packaging (CSP) is a type of packaging technique that does not use an additional SMT package. In this packaging configuration, the ASIC is "formed" with a feature for making direct electrical connection to the PCB. One example is ASICs formed with solder balls or metal posts with solder caps that can be directly soldered to a higher level board, for example, a PCB. In some cases an underfill material is used to provide additional mechanical support for the package. This underfill is placed between the ASIC and the PCB.

These ASIC packages are compatible with 'pick and place' solder reflow assembly. This is a process of rapidly assembling components on a PCB. The components are placed onto component footprints on the PCB and then heated with an oven. The oven can reach temperatures as high as 260 deg. C. to reflow solder between the component and the PCB. As the PCB is cooled the solder hardens to make a solid joint with the so-placed component. The PCB may then be 'washed' with a solvent or water solution to remove flux (which facilitates the solder process). While this is a simple procedure for semiconductor devices, the oven heating procedure and washing can be deleterious to fiber optic components.

A fiber optic component that is compatible with SMT packaging would offer significant benefits, such as lower cost of component manufacturing and PCB assembly, a compact PCB footprint and a reduced parasitic electrical interface. Such a fiber optic component could be packaged in a standard SMT packages with minimal or no modification. An optical transceiver design that can be packaged in SMT package is possible if it had sealed optical lens elements, sealed electrical paths, and is constructed in a manner that could withstand large temperature variations, and had the capability to have a removable fiber optic connector.

In view of the above, systems and methods for a fiber optic transceiver that are compatible with packaging into standard semiconductor packages and in SMT applications are presented below. Additionally, various aspects of the optical interconnection system, the construction of the transceiver, and the method of assembly are presented.

Accordingly, these fiber optic components can provide high-density optical communications to computing, sensors and data processing systems. For various embodiments, the fiber optic component can be solder assembled in a location on the PCB that is in close proximity to integrated circuits. This can reduce the length and complexity of routing of electrical lines used for data communications.

In one embodiment, a fiber optic transceiver is formed using materials that will withstand solder assembly processes. In another embodiment, the fiber optic transceiver can be packaged into a SMT package, similar or identical to those packages developed by the semiconductor industry for packaging ASICs. In this embodiment, the transceiver can be thermally and electrically connected into the SMT package. The thermal contact can be formed by with an interface material between the fiber optic transceiver and the thermal path of the SMT package. This bonding material can be a thermally conductive epoxy or a thermally conductive paste. The thermal path of the SMT can be a metal pad at the bottom of the package. The electrical connections are formed by electrical conduits between electrical contacts on the transceiver and electrical contacts in the SMT package. These electrical conduits can be wire-bonds, ribbon-bonds, solder balls, columns of metal, or other interconnect technologies. The transceiver within the SMT package can have a mechanism to protect the electrical conduits, such as 'glob-top', plastic encapsulate, mechanical structure (such as a lid or cover) or other methods. The SMT package can have electrical contacts on the exterior of the package for creating electrical conduits to a substrate, such as a PCB, interposer, or circuit card within a larger assembly. These contacts can provide a contact means for solder assembly to the substrate.

In another embodiment, the fiber optic transceiver can be of a non-SMT package configuration, being formed with electrical connection technology that allows direct connection to a substrate with electrical wiring, such as a PCB, interposer, or circuit card within a larger assembly. The fiber optic transceiver may have solderballs, metal posts or other electrical conduit technology that allows direct electrical connection to the substrate. The fiber optic transceiver may have an underfill between the transceiver and the host substrate.

In some embodiments, the fiber optic transceiver can contain the precision alignment and assembly of OE devices, integrated circuitry and lens devices onto a carrier containing wire-bond pads or other standard electrical interface, referred to here as an optical core (Core) sub-assembly. The Core can ease assembly requirements for incorporation into a fiber optic module by providing, for example, a wire-bondable electrical interface and an optical interface with relaxed alignment tolerances.

In other embodiments, the fiber optic module, containing a fiber optic transceiver and fiber connector, can be manufactured using a process comprised of five main steps: 1) Core (OE device, transparent substrate and lens, and optionally an interposer) assembly—using precision flip-chip bonding steps (makes the critical alignment of the OE devices to lenses), 2) module substrate assembly, populating a substrate with passive and/or active electrical components, lead frame interconnect and mechanical structures for supporting a lid, 3) module assembly, wire-bonding (or ribbon bonding or flip-chip attach) of the optical Core into the substrate, 4) sealing the module, and 5) attaching a fiber connector cable assembly (the fiber connector assembly contains lenses precisely aligned the fibers and a method for turning the light approximately 90 degrees).

This splits the manufacturing potentially into two areas that can be distinguished by the assembly tolerances. The creation of the transceiver and the fiber connector assembly requires tight (<10 micron) alignment of components (described in Steps #1 and #5). The remaining steps have relatively loose tolerances (>10 microns), including the attachment of the fiber connector assembly to the transceiver and creating electrical connections to the transceiver.

The fiber connector assembly can be held in place, for example, with an epoxy. This can be a semi-permanent attachment, allowing the top cable assembly to be replaced if necessary. The fiber connector assembly can be held in place with a removable retention mechanism. The retention mechanism can apply a spring load to hold the lens in place during operation in an environment with vibration, shock and thermal excursions. The spring load can be supplied with a spring supported by a base, such as frame.

The base can be anchored to the final substrate (for example, PCB) or the base is anchored to the SMT package or fiber optic transceiver. If the base is anchored to a SMT package or fiber optic transceiver, the retention mechanism and the base will remain in registration to each other during assembly to the final substrate.

The fiber optic transceiver can contain optical lens elements that are sealed against exposure to liquids or gasses. Lenses often leverage the refractive index difference between materials to process the light. For example, glass can have a refractive index of 1.5 and has a refractive index of 1.0. The curved surface of a lens imparts a phase change to the light signal that can create a focusing or collimating effect.

Generally, the optical path and lens surface are sensitive to contamination. Contamination can occur when a foreign liquid is present on the lens surface or in the optical path. Contamination can occur when a gas is present in the optical path, or condenses to form a liquid or solid on the lens or in the optical path. During the solder assembly process and during subsequent washing, gasses and liquids are presented to components being assembled. Gasses may bloom onto lens surfaces. Accordingly, fiber optic transceivers may be exposed to gasses and liquids during operation. Also, cold environments may cause water to condense from air and form on components.

In view of this, in various embodiments, the fiber optic connector can contain optical elements that are sealed against exposure to liquids or gasses. The optical lenses may be formed in a corner turn connector so that the light path remains interior the connector material. The connector can be coated with a protective film, such as metal, to protect the turning surface from contamination. The metal can also form a reflector to aid in the corner turn processing of the light.

Further, the optical path between the transceiver and the fiber optic connector can be sealed from contamination with a gasket. The gasket can be formed in an optically transparent material and be present in the optical path. The material can provide compliance between the differences in the thermal expansion of the transceiver and the fiber optic connector. One non-limiting example of a suitable material is silicone. The material in the optical path can also provide for the reduction of Fresnel reflections from the transceiver and fiber connector interface surfaces.

In some embodiments, the system can create an optical module with less than 10 mm of overall height. This system can create an optical module that would operate in a wide temperature range, −55 deg. C. to 100 deg. C. The transceiver can be configured to have a 'delta-T' (temperature difference between the laser and case) of less than 10 deg. C. One embodiment of the system would allow operation up to 125 deg. C. by incorporating an active cooling element on the laser device.

The materials used in the fiber optic transceiver can be chosen to have a matching coefficient of thermal expansion (CTE), for example within +/−5 ppm/C. Example materials are GaAs, sapphire, ceramic (including low-temperature co-fired ceramic—LTCC), BK-7, ZnSe, and Kovar. A module constructed of these materials would have minimal stresses on the material interfaces in all dimensions (X, Y, and Z).

The fiber optic connector material can be a thermoplastic, which can be molded with precision features that align the fibers to lens elements. Thermoplastics typically have a CTE that does not match the material used to make optoelectronic devices. If the optical coupling system implements a collimated beam interface, the fiber optic transceiver can have a different CTE than the fiber optic connector and perform efficient coupling over temperature variations. A slip-joint interface can be used for mechanical alignment of the fiber optic connector to the transceiver. The slip-joint allows the fiber connector to expand at a different rate than the transceiver without creating mechanical stress at the mating interface. Various examples of the embodiments described above are detailed in the following FIGS.

FIG. 1 is a perspective view 100 of an embodiment of a fiber optic transceiver assembly formed with an optical transceiver 108, protective cover 105, solderable package 104, and fiber optic connector 112. Fiber optic connector 112 is mated to optical transceiver 108 which is packaged with solderable package 104 having electrical contacts 109. A solderable package 104 is a package that can be soldered to make electrical connection to a higher level assembly (not shown), a non-limiting example being a PCB. The solderable package 104 shown is referred to as a quad-flat no-lead (QFN) package, but any of numerous package types may be used. The fiber optic connector 112 is held to the optical transceiver 108 with connector retention 116, shown here as a bar, though other forms may be used. The connector retention 116 is held to a mount 120 using a fastener 124. The mount 120 may be part of the higher level assembly.

Figure 2A:
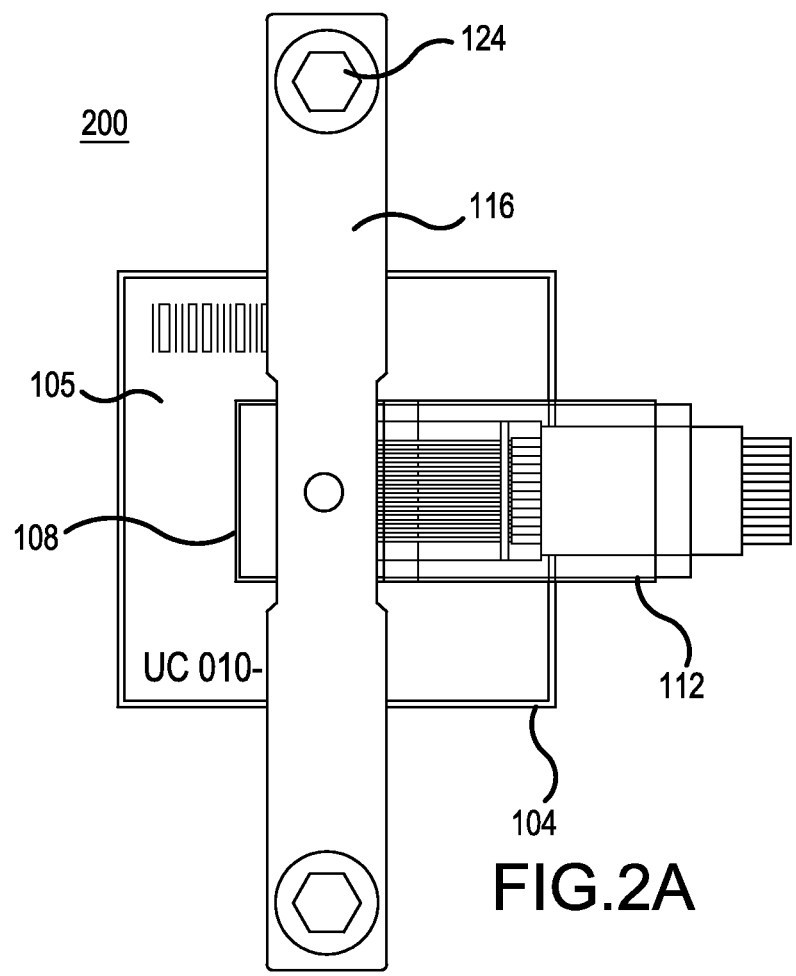
FIG. 2A is a top view of an embodiment of a fiber optic transceiver assembly with a fiber optic connector connected to an optical transceiver with a protective cover, which is connected to solderable package.

FIG. 2A is a top view 200 of an embodiment of a fiber optic transceiver assembly with optical transceiver 108, protective cover 105, which is connected to solderable package 104, the optical transceiver 108 being attached to fiber optic connector 112. The fiber optic connector 112 is held in place by a connector retention 116, which is mounted with a fastener 124.

Figure 2B:
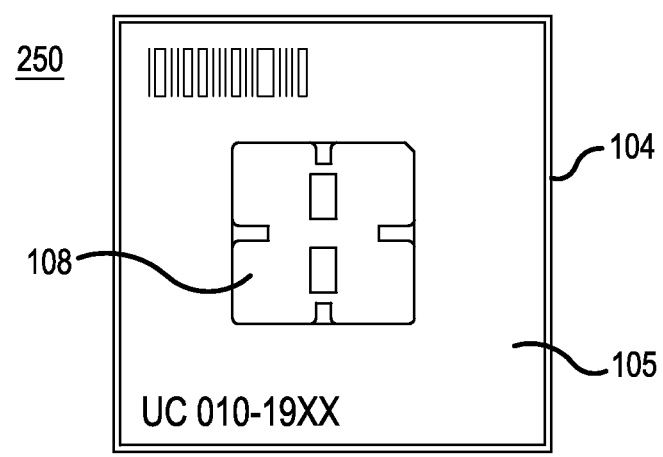
FIG. 2B is a top view of the fiber optic transceiver assembly of FIG. 2A without the fiber optic connector and connector retention/fastener.

FIG. 2B is a top view 250 of the fiber optic transceiver assembly of FIG. 2A without the fiber optic connector and connector retention/fastener, showing optical transceiver 108, protective cover 150, and solderable package 104.

Figure 3A:
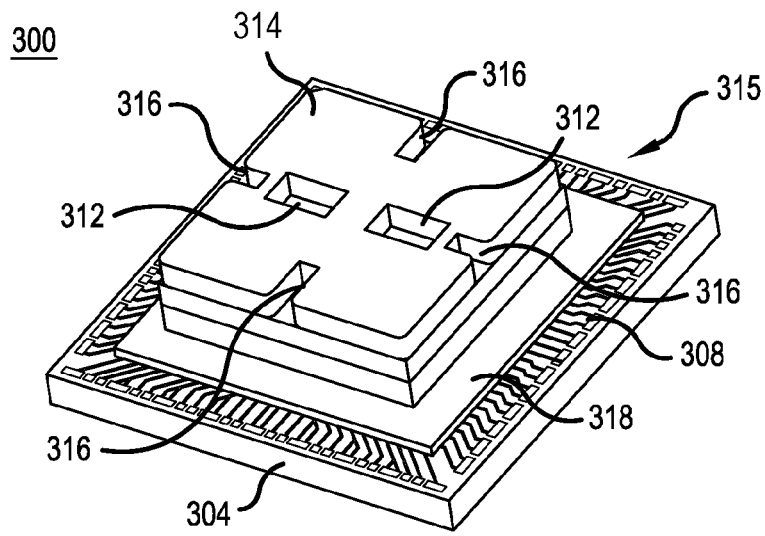
FIG. 3A is a perspective view of an embodiment of an optical transceiver setup suitable for packaging with a solderable package.

FIG. 3A is a perspective view 300 of an embodiment of an optical Core suitable for packaging with a solderable package. The optical Core 315 is electrically coupled to an intermediary board 304 (e.g., interposer) that has an electrical interface 308 which allows for electrical connections between carrier 318 and a solderable package (not shown). The form of the electrical connections can be with wire-bonds, ribbon-bonds, solder balls, solder columns or other types of electrical conduits. The optical Core 315 has a connector mount interface 314 with alignment features 316 for use in mating and aligning of a fiber optic connector (not shown). The connector mount interface 314 has optical ports 312 which are regions reserved for optical paths that are substantially collimated. The respective optical signal can be either exiting or entering the optical transceiver 315 through these ports 312. One or more optical attenuators (not shown) may be present in the optical path.

Figure 3B:
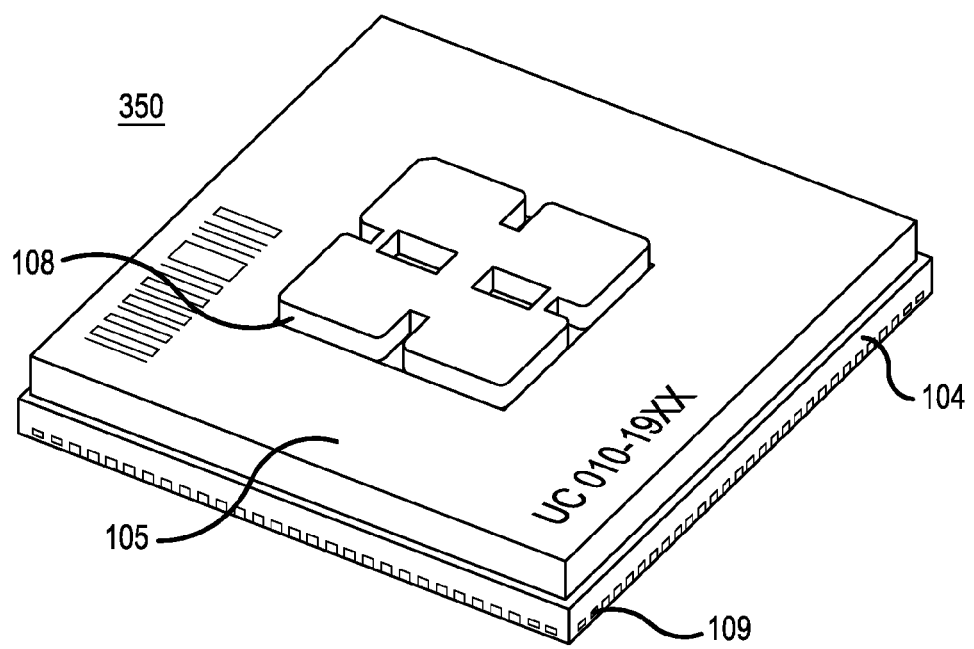
FIG. 3B is a perspective view of the optical transceiver setup of FIG. 3A.

FIG. 3B is a perspective view 350 of the optical Core setup of FIG. 3A configured as a packagable optical transceiver module. Optical transceiver 108 is covered with protective cover 105 and attached to solderable package 104. The packagable optical transceiver module can be attached to a higher level board (not shown) via connections 109 from the solderable package 104. The electrical interface 308 shown in FIG. 3A is protected by package cover 105 that provides protection from contamination of the electrical connections between the optical transceiver 108 and solderable package 104. Examples of the package cover 105 can be an over-molded plastic, glob-top coating, conformal coat material, a metal lid or any other suitable material to protect the electrical interface 308.

Figure 4:
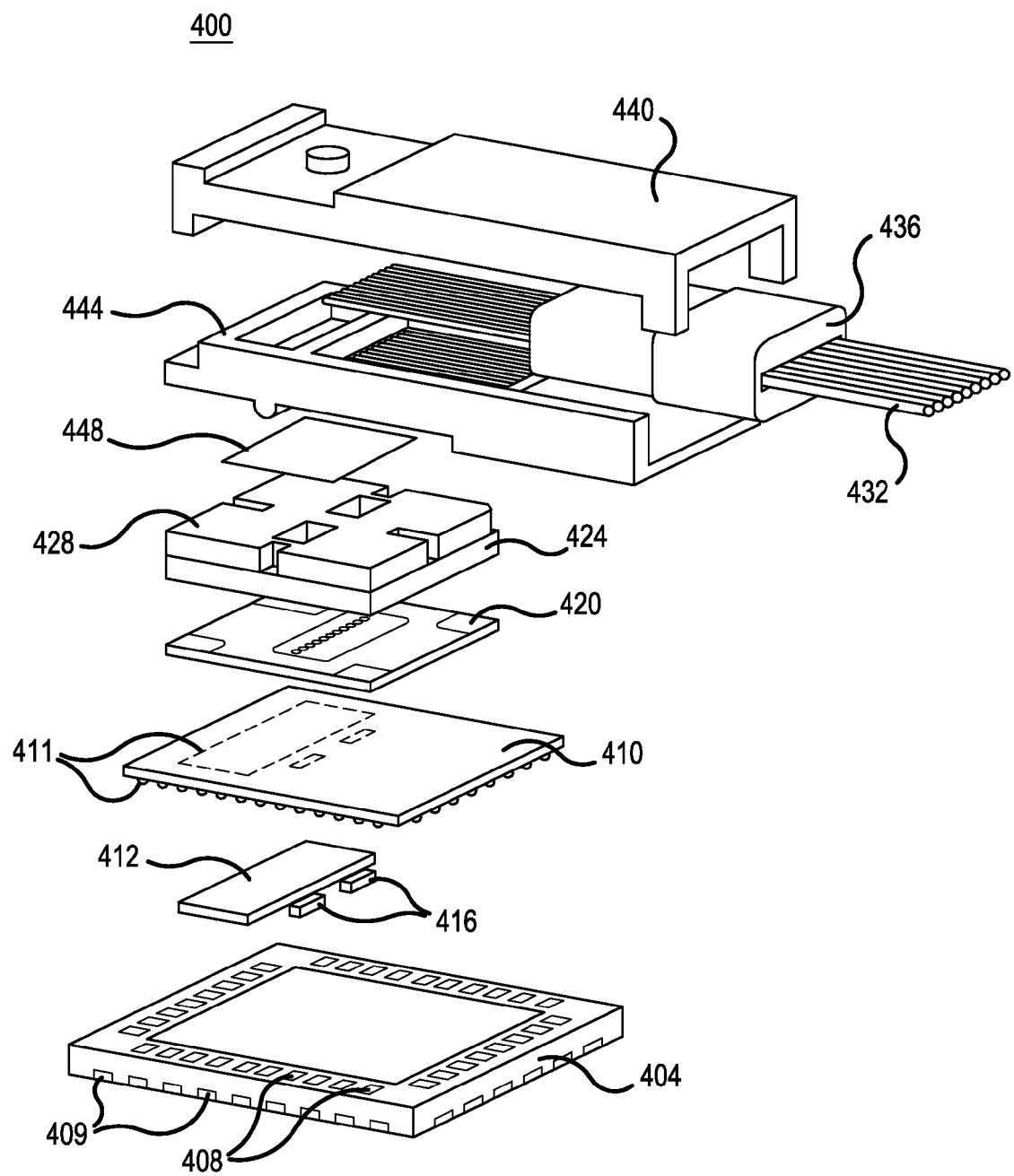
FIG. 4 shows a blow-up view of an embodiment of an optical transceiver setup and fiber optic connector, without a protective cover.

FIG. 4 shows a blow-up view 400 of an embodiment of an optical transceiver setup and fiber optic connector, without a protective cover. The fiber optic connector can be composed of a connector lens 444 with lensing element(s) (not shown) that couple light from the fiber cable 432 and direct it through the bottom of the connector lens 444. The lensing element(s) can operate on one or more fibers. For highest efficiency, the light is formed in collimated beams. A lens cap 440 can provide mechanical support for holding the fibers within the fiber cable 432 in the fiber connector lens 444, as well as protection of the exposed fibers. The lens cap 440 and connector lens 444 can also hold the strain relief 436 element on the fiber cable 432. An optical gasket 448 can be formed at the interface between the connector lens 444 and the connector guide 428. The optical gasket 448 can seal the optical interface from contamination and also reduce Fresnel reflections in the optical path. The optical gasket 448 can be a compliant material that maintains contact with the connector lens 444 and connector guide 428. Non-limiting examples of complaint materials are silicone, polymer gels, grease, and so forth.

The connector guide 428 can be mounted to a lens seal 424. The mounting can be performed with an adhesive bond or ionic bond. The connector guide 428 and lens seal 424 can also be formed by bonding via a wafer bond process, using for example, a silicon wafer and a glass wafer, and etching features into the silicon using the glass wafer as an etch stop. These features can form optical ports and alignment mechanisms. The connector guide 428 can be formed, for example, in para-aramid, phenolic, polymer, metal, glass, or other materials that can be etched or laser trimmed to create these features.

A collimating lens 420 couples light from optoelectronic devices 416 to the connector lens 444. In some embodiments, the light is collimated at the interface between the connector lens 444 and connector guide 428. The lenses on the collimated lens 420 can be formed in a cavity, so that they do not extend above the surface of the collimating lens 420 substrate. The collimating lens 420 can be mounted to the lens seal 424 in such a manner that seal the lenses from contamination. The collimating lens 420 and lens seal 424 can be adhesively sealed, solder sealed or sealed with ionic bonding, wafer bonded, and so forth. The collimating lens 420 can have an anti-reflective coating. The lens seal 424 can have an anti-reflective coating. The collimating lens 420 or lens seal 424 can have pockets to control and hold epoxy during the bonding of the collimating lens 420 to the lens seal 424. The collimating lens 420 can be formed in a wafer form. The lens seal 424 can be formed in wafer form. The lens seal 424 can have patterns, such a chrome images, to aide in alignment during bonding of the collimating lens 420 to the lens seal 424.

The collimating lens 420 can be bonded to the lens seal 424 in wafer form and then diced out as an assembly. The bonding can be performed adhesively, with a solder process or with ionic wafer bonding. The lens seal 424 can be bonded to the connector guide 428 and the collimating lens 420 in wafer form and diced out as an assembly. The bonding of each of these interfaces can be performed adhesively, with a solder process or, alternatively, for example, with ionic wafer bonding. Accordingly, a "sealed" interface between the collimating lens 420, lens seal 424 (as well as connector guide 428, if so configured) is provided that is resistant to exterior contamination from gases, liquids and the like.

Optoelectronic can be mounted (for example, via flip-chip mounting) on a transparent carrier 410 that contains electrical interconnect routing 411. The optoelectronic devices 416 are in electrical communication with the electrical routing 411 on the transparent carrier 410. The collimating lens 420 is aligned to the optoelectronic devices 416 and mounted to the transparent carrier 410. The mounting can be adhesive, soldered or ionic bonded. The collimating lens 420 can have features on the optoelectronic side of the component to aid in alignment to the optoelectronic devices 416.

An ASIC 412 or other electrical components can be electrically attached to the transparent carrier 408. Some examples of electrically attach are wire-bonding, ribbon-bonding, flip-chip, and solder ball. The ASIC 412 is in electrical communications with the electrical routing 411 on the transparent carrier 408. The transparent carrier 408 can be electrically attached to an interposer 404. The interposer 404 has electrical routing 408 that connects signals from electrical routing 411 on the transparent carrier 408 to contacts 409 for interfacing to a solderable package such as a higher level board (e.g., PCB).

In some embodiments, the transparent carrier 408, being of a semiconductor material, can be fabricated with an ASIC 412 (or other electrical component) as an integral feature of the transparent carrier 408. As a non-limiting example, using a silicon on sapphire (SOS) process, the transparent carrier 408 can be formed with integrated circuitry (e.g., ASIC), thereby bypassing the need to have the ASIC 412 separately mounted to the transparent carrier 408. In other embodiments, it may be more economical to have the ASIC 412 (or other electrical component) separately mounted.

Figure 5:
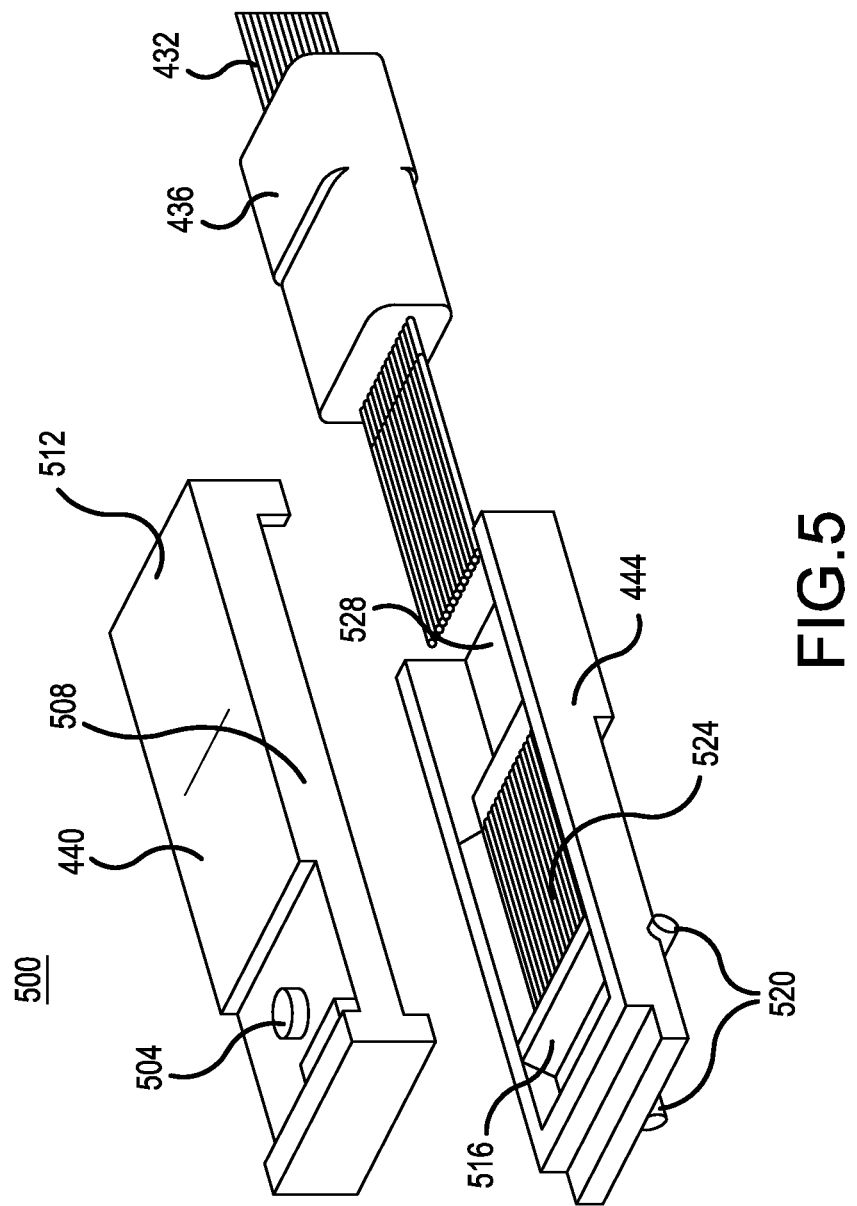
FIG. 5 shows a blow-up view of one embodiment of a fiber optic connector.

FIG. 5 shows a blow-up 500 view of one embodiment of a fiber optic connector. The lens cap 440 can have a retention support 504 feature used for aligning and attaching a connector retention mechanism (not shown). The lens cap 440 can have a fiber capture 508 feature (for example, on an underside of the lens cap 440) that provides for securing fibers within the fiber cable 432 to the connector lens 444. The lens cap 440 can have an upper strain relief capture 512 feature for securing the strain relief 436 on the fiber cable 432. The connector lens 444 has lens(es) 516 (e.g., corner turn) that process light from the fibers in the fiber cable 432. The connector lens 444 has fiber mount 524 features for securing and aligning the fibers to the lens(es) 516. The connector lens 444 can have a lower strain relief capture 528 for securing the strain relief 436 on the fiber cable 432. The strain relief 436 can be held in place by the upper strain relief capture 512 and lower strain relief capture 528 with mechanical friction or epoxy or other securing mechanisms. The fibers 432 can be held in place with an epoxy between the connector lens 444 and the lens cap 440. An epoxy can aid in sealing the optical path, securing the connector lens 444 to the lens cap 440, and reducing Fresnel reflections that may occur between the fiber end and the connector lens material. The connector lens 444 can have upper alignment features 520 that are aligned to the lens(es) 516.

Figure 6A:
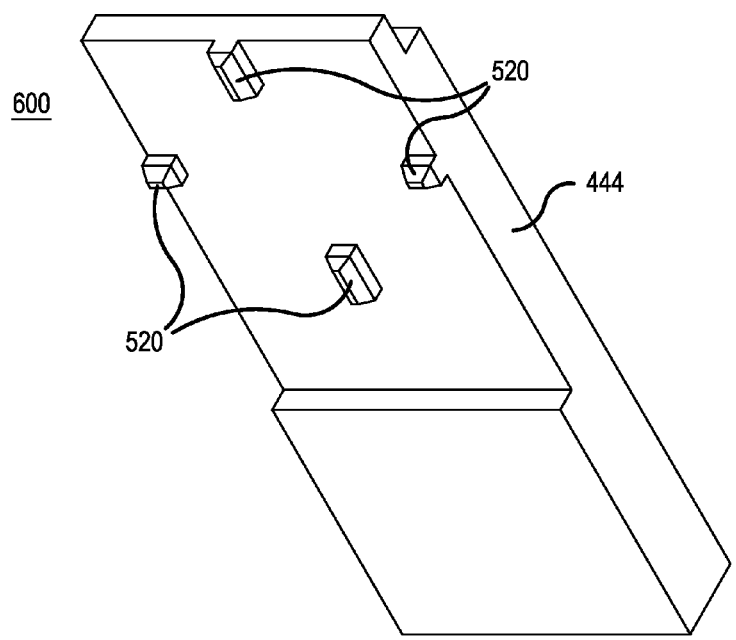
FIG. 6A is a bottom perspective view of an embodiment of a connector lens for a fiber optic connector.

FIG. 6A is a bottom perspective view 600 of an embodiment of a connector lens 444 for a fiber optic connector. The connector lens 444 can have one or more upper alignment features 520 that provide for a slip-joint interface to a transceiver. The slip-joint allows the connector lens 444 to expand at a different thermal rate than the transceiver without causing mechanical strain at the interface.

Figure 6B:
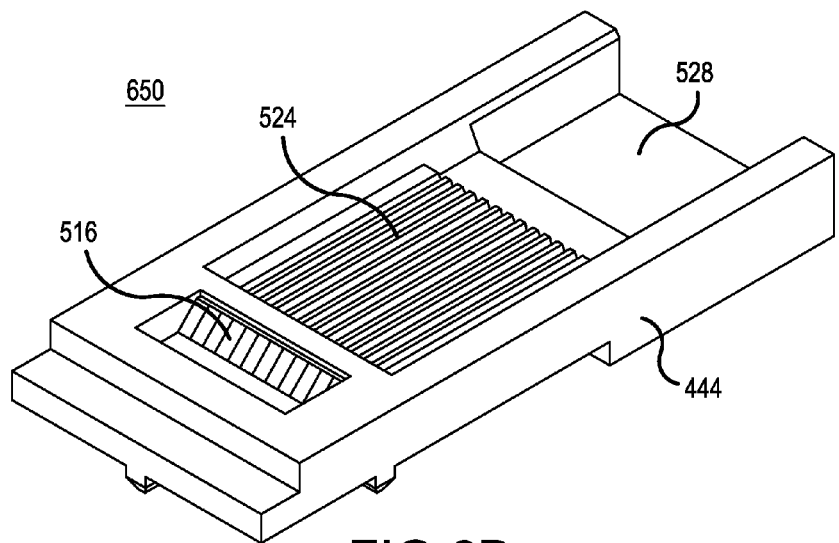
FIG. 6B is a top perspective view of an embodiment of a connector lens for a fiber optic connector.

FIG. 6B is a top perspective view 650 of an embodiment of a connector lens 444 for a fiber optic connector. The fiber mount 524 can be an array of V-grooves, U-grooves or other elements for securing fiber positions. The lens(es) 516 can be formed in the connector lens 444 material. The light from the fibers can enter the connector lens 444 material and strike the lens(es) 516 and turn downward in the connector lens 444 in a collimated beam format. The lens(es) 516 can be coated to prevent contamination. The coating may reduce the reflectivity of the len(es) 516.

Figure 7:
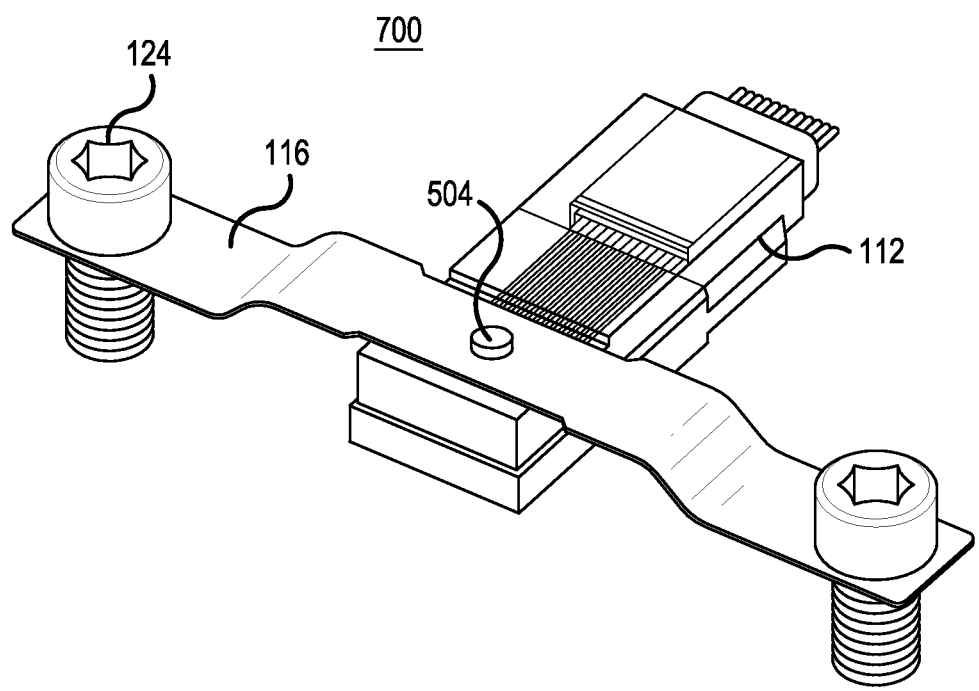
FIG. 7 is a perspective view of an embodiment of a fiber optic connector with an integrated retention mechanism.

FIG. 7 is a perspective view 700 of an embodiment of a fiber optic connector with an integrated retention mechanism. The fiber optic connector 112 can have a connector retention 116 attached using a retention support 504 mechanism. The connector retention 116 can have a fastener 124 held captive to the connector retention 116.

Figure 8A:
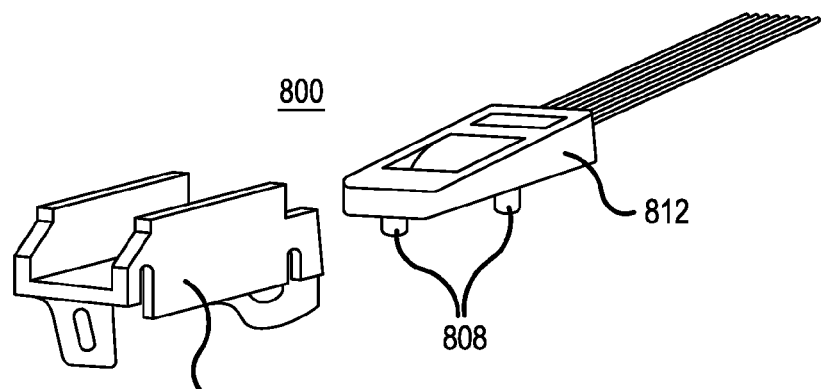
FIG. 8A is an illustration of a prior art fiber optic connector suitable for mating with an embodiment of a fiber optic transceiver in a solderable package.

FIG. 8A is an illustration 800 of a prior art fiber optic connector suitable for mating with an embodiment of a fiber optic transceiver in a solderable package. This fiber optic connector 812 has upper alignment pins 808 and is shown with a connector retention 804 mechanism that is of a different form factor than shown in the previous FIGS.

Figure 8B:
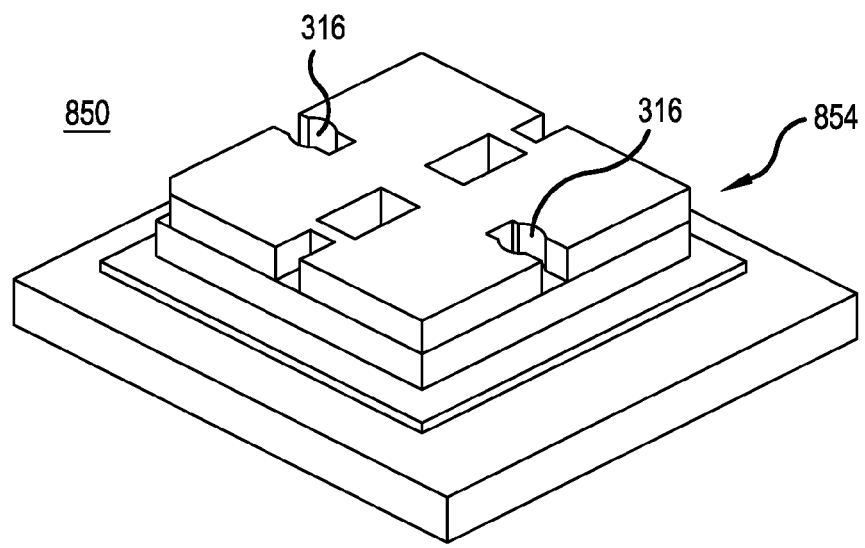
FIG. 8B is an illustration of an embodiment of an optical transceiver setup suitable for packaging in a solderable package that can be mated to the prior art fiber optic connector of FIG. 8A.

FIG. 8B is an illustration 850 of an embodiment of an optical transceiver setup suitable for packaging in a solderable package that can be mated to the prior art fiber optic connector of FIG. 8A. The top portion of the optical transceiver 854 can have lower alignment guide holes 316 that mate to the alignment pins 808 of the fiber optic connector 812 shown in FIG. 8A.

Figure 9:
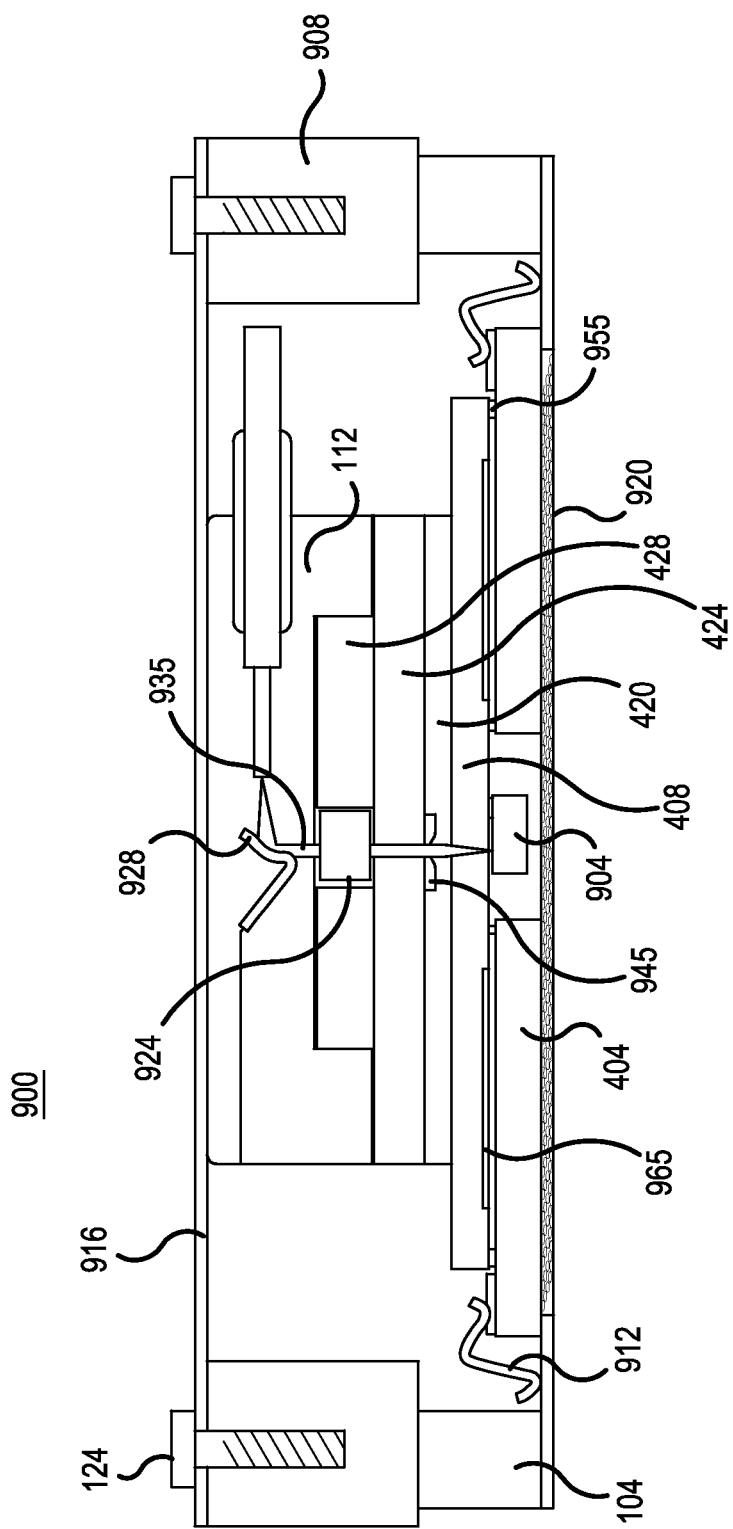
FIG. 9 is cut-away view of an embodiment of a packagable fiber optic transceiver wire-bonded to a solderable package, with an attached fiber connector.

FIG. 9 is cut-away view 900 of an embodiment of a packagable fiber optic transceiver wire-bonded to a solderable package, with an attached fiber connector. Fiber connector 112 is held in position with connector retention 916 which is fastened to a support frame 908 with a fastener 124. The support frame 908 is mounted to the solderable package 104. This mounting can be performed mechanically, with an adhesive or any other suitable mounting mechanism. The fiber optic connector 112 can have a coated corner turn lens 928 that processes light from a fiber to form a collimated beam 935. The collimated beam 935 may have an optical attenuator 924 in its path. The fiber optic connector 112 can be mated to a connector guide 428, which in turn is mounted to a lens seal 424, which in turn is mounted to a collimating lens 420, which in turn is mounted to a transparent carrier 408. Light from a laser 904 is further collimated by the collimating lens 420. The lens cavity 945 on the collimating lens 420 can be sealed with the lens seal 424. The seal can be formed by adhesive bonding, solder bonding, ionic bonding or via a wafer processing method. The transparent carrier 408 has electrical wiring 955 for contact with components disposed on transparent carrier 408 (for example, laser 904) and is in electrical communication with the interposer 404. The electrical contact between the transparent carrier 408 and the interposer 404 can be performed with flip-chip contacts, conductive epoxy, solder balls, wire-bonds or other methods of creating electrical conduits. The interposer 404 is in electrical communications with the solderable package 104 with one or more electrical conductors 912. The electrical conductors 912 can be wire-bonds, ribbon-bonds, conductive epoxy, solderballs or other methods of creating electrical conduits. The apparatus can be in thermal contact with a thermal interface region 920 formed in base of the solderable package 104.

Circuit elements 965 shown at the bottom of transparent carrier 408 can be ASICs/electrical components either mounted to the transparent carrier 408 or integrally formed "with" transparent carrier 408. Circuit elements 965 will be in electrical communication with electrical wiring 955 and/or with laser 904.

Figure 10A:
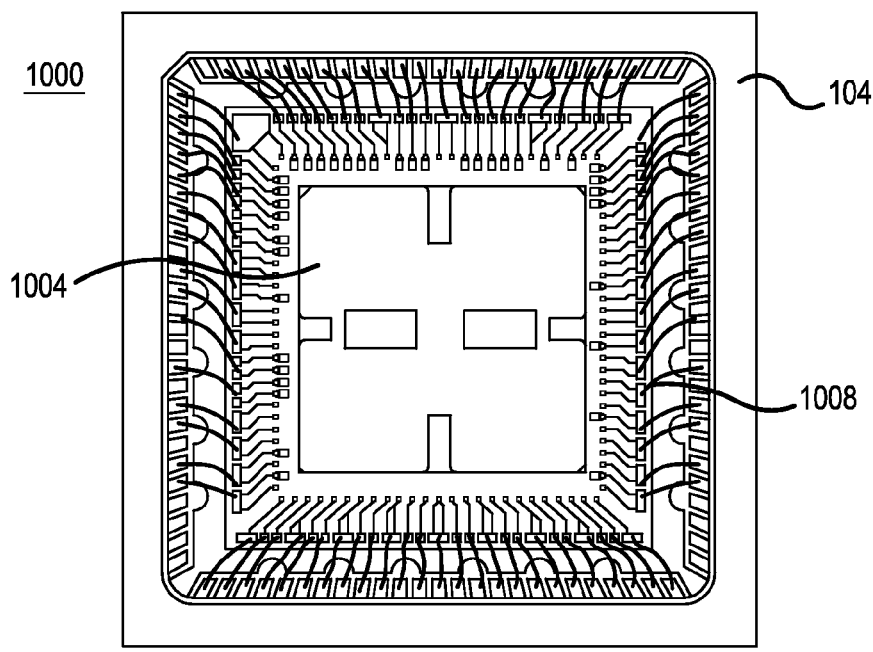
FIG. 10A is a top view of an uncovered embodiment of an optical transceiver electrically connected to a solderable package with electrical conductors.

FIG. 10A is a top view 1000 of an uncovered embodiment of an optical transceiver 1004 electrically connected to a solderable package 104 with electrical conductors 1008. The electrical conductors 1008 can be wire-bonds, ribbon-bonds, conductive epoxy, solderballs or other methods of creating electrical conduits.

Figure 10B:
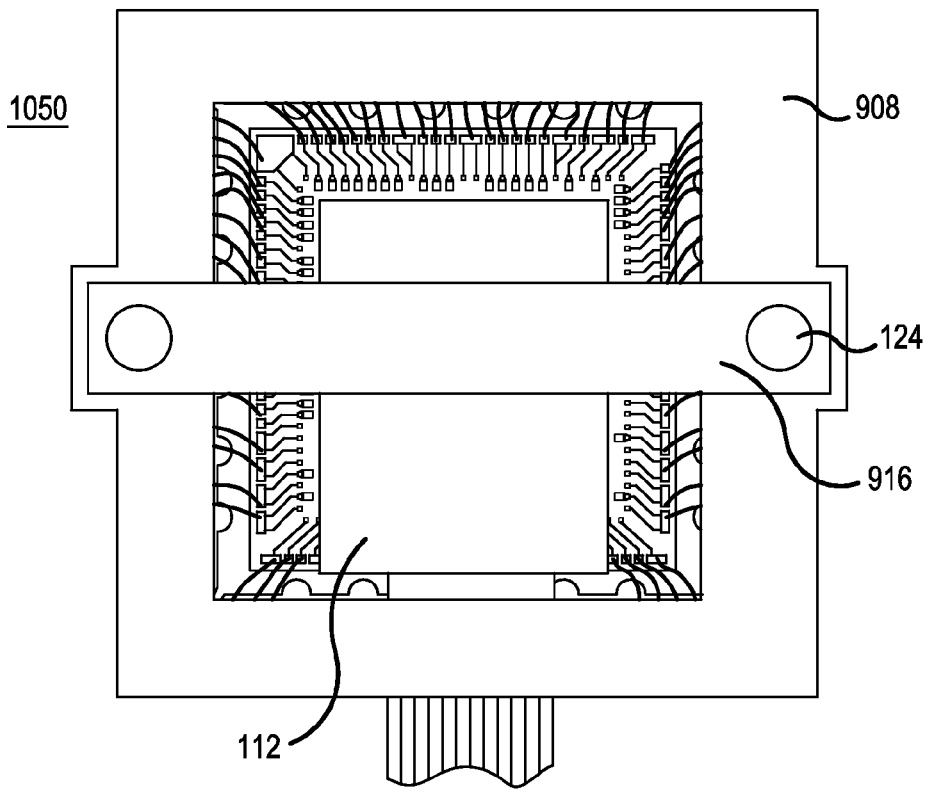
FIG. 10B is a top view of the embodiment of FIG. 10A wire-bonded into a solderable package with a retentioned fiber optical connector.

FIG. 10B is a top view 1050 of the embodiment of FIG. 10A wire-bonded into a solderable package with a retentioned fiber optical connector. Retention of the fiber optical connector 112 is shown with a bar-like connector retention 916. A fastener 124 holds the connector retention 916 to the support frame 908 which is mounted to the solderable package (not shown).

Figure 11:
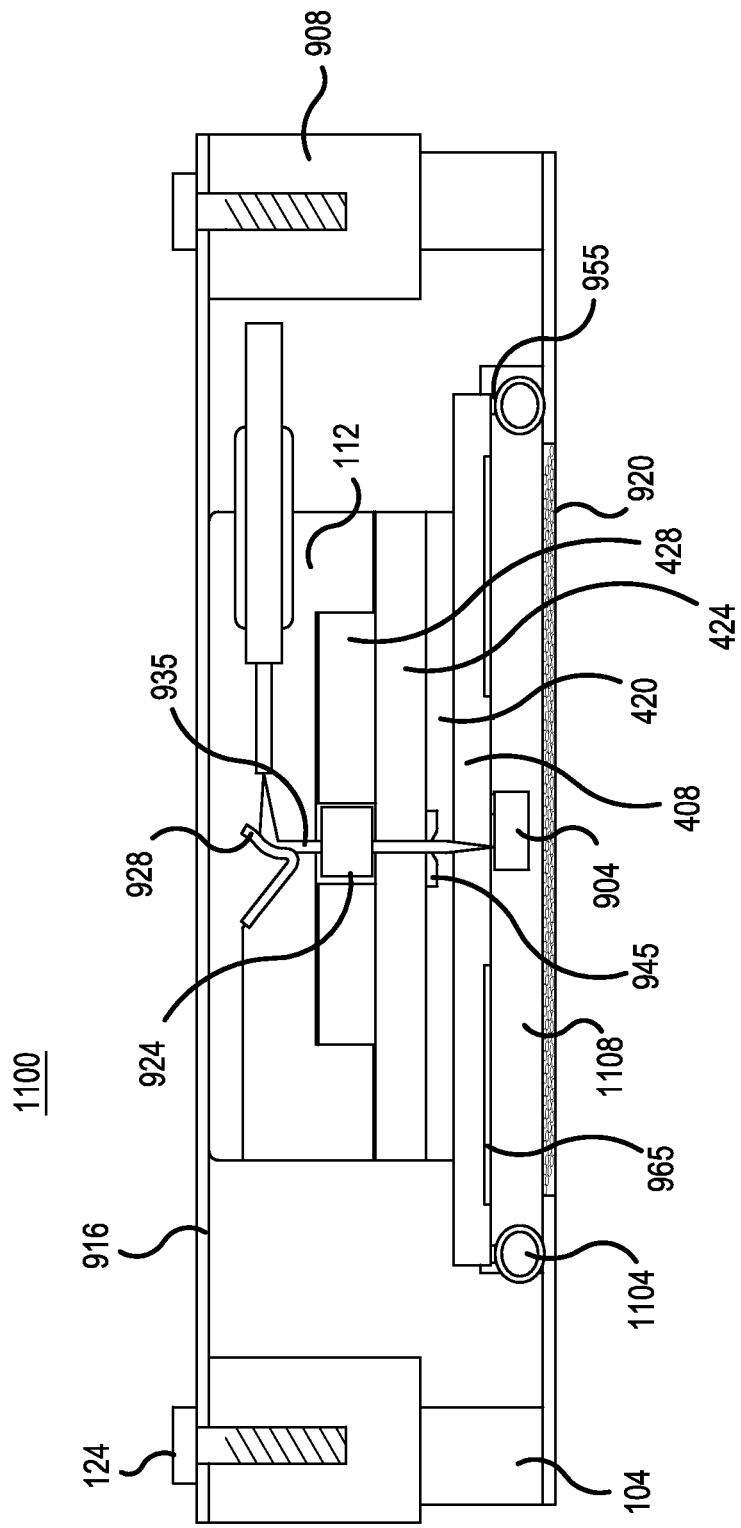
FIG. 11 is a side cut-away view of an embodiment of an interposerless packagable fiber optic transceiver "soldered" to a solderable package, with an mounted fiber connector.

FIG. 11 is a side cut-away view 1100 of an embodiment of an interposerless packagable fiber optic transceiver "soldered" to a solderable package, with an mounted fiber connector. This embodiment is very similar to the embodiment shown in FIG. 10, a significant difference being that the packagable fiber optic transceiver is shown as directly connected to the solderable package via a solderable method (for example, a solder ball) without the use of an interposer. The fiber connector 112 is held in place with connector retention 916, shown here as held to a support frame 908 with a fastener 124. The support frame 908 is mounted to the solderable package 104. This mounting can be performed with an adhesive or other suitable attachment mechanism. The fiber optic connector 112 can have a coated corner turn lens 928 that processes light from a fiber to form a collimated beam 935. The collimated beam 935 may have an optical attenuator 924 in its path. The fiber optic connector 112 can be mated to a connector guide 428, which in turn is mounted to a lens seal 424, which in turn is mounted to a collimating lens 420, which in turn is mounted to a transparent carrier 408. Light from a laser 904 is further collimated by the collimating lens 420. The lens cavity 945 on the collimating lens 420 can be sealed with the lens seal 424. The seal can be formed by adhesive bonding, solder bonding, ionic bonding or via a wafer processing method. The transparent carrier 408 has electrical wiring 955 for contact with components disposed on transparent carrier 408 (for example, laser 904) and is in electrical communication with the solderable package 104 via direct electrical conductors 1104. The direct electrical connectors 1104 can be flip-chip contacts, conductive epoxy, solder balls, wire-bonds or other methods of creating electrical conduits. For an embodiment with a soldered connection, the direct electrical connector 1104 must be able to withstand the subsequent solder reflow assembly of the solderable package 104. An underfill 1108 can be provided between the transparent carrier 408 and the thermal interface region 920. The underfill 1108 can enhance the thermal path or enhance the mechanical stability of the interface.

Circuit elements 965 shown at the bottom of transparent carrier 408 can be ASICs/electrical components either mounted to the transparent carrier 408 or integrally formed "with" transparent carrier 408. Circuit elements 965 will be in electrical communication with electrical wiring 955 and/or with laser 904.

Figure 12:
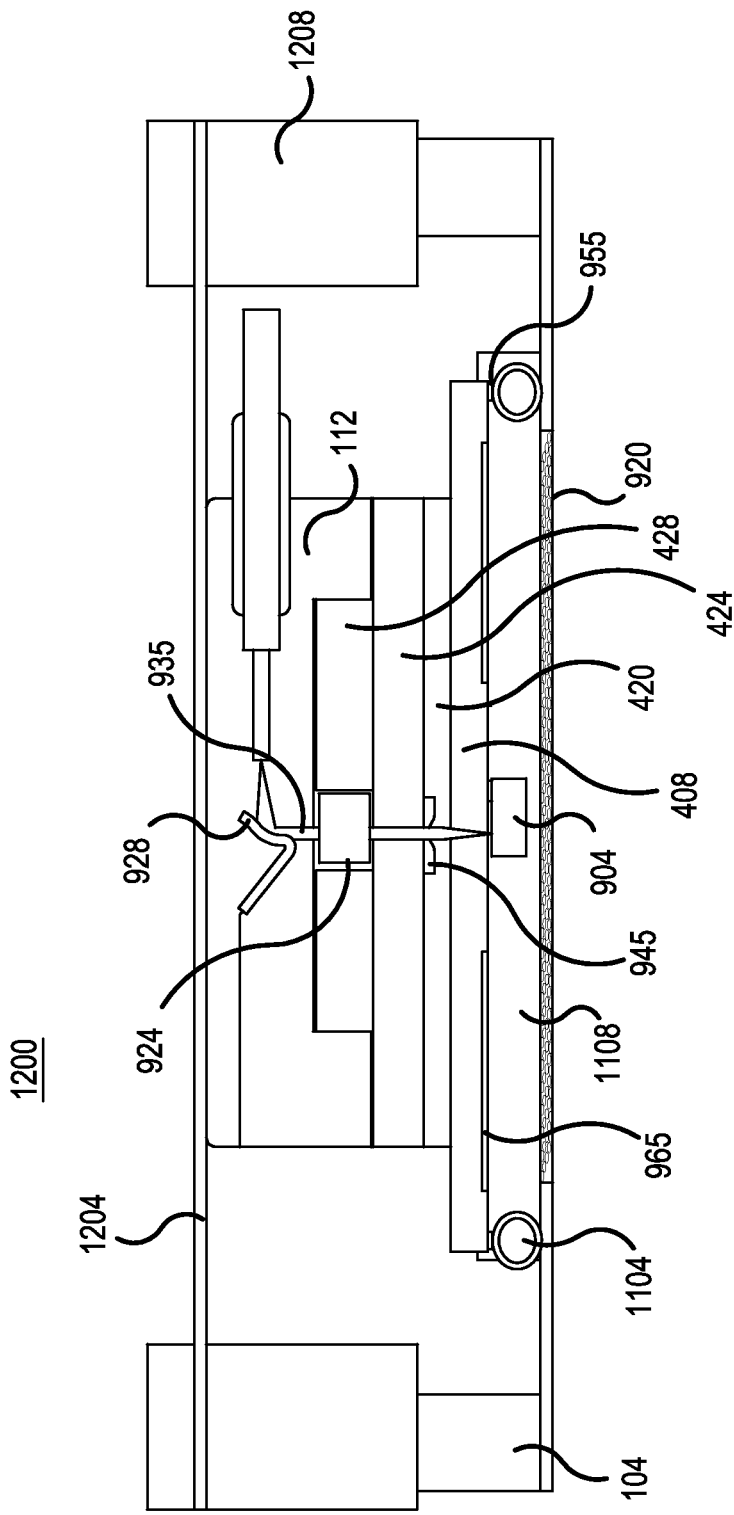
FIG. 12 is a side cut-away view of another embodiment of an interposerless packagable fiber optic transceiver mounted to a solderable package, with an attached fiber connector.

FIG. 12 is a side cut-away view 1200 of another embodiment of an interposerless packagable fiber optic transceiver mounted to a solderable package, with an attached fiber connector. This embodiment is very similar to the embodiment shown in FIG. 11, a significant difference being that the fiber connector retention configuration is altered. The fiber connector 112 is held in place with connector retention 1204 which is held to a support frame with retention holder 1208. The support frame with retention holder 1208 is mounted to the solderable package 104. This mounting can be performed with an adhesive or other suitable material. In this embodiment, the mechanism for attachment of the connector retention 1204 can be via a method or mechanism that is different than shown in FIG. 11. For example, a frictional, clip, epoxy, etc. method or mechanism can be used, according to design preference. If a frictional or clipping method is used, then quick release of the connection retention 1204 can be facilitated. Moreover, the connector retention 1204 may also be "permanently" attached to the support frame with retention holder 1208, thereby the support frame with retention holder 1208 may be used as "the" attachment mechanism to the solderable package 104. The fiber optic connector 112 can have a coated corner turn lens 928 that processes light from a fiber to form a collimated beam 935. The collimated beam 935 may have an optical attenuator 924 in its path. The fiber optic connector 112 can be mated to a connector guide 428, which in turn is mounted to a lens seal 424, which in turn is mounted to a collimating lens 420, which in turn is mounted to a transparent carrier 408. Light from a laser 904 is collimated by the collimating lens 420. The lens cavity 945 on the collimating lens 420 can be sealed with the lens seal 424. The seal can be formed by adhesive bonding, solder bonding, ionic bonding or via a wafer processing method. The transparent carrier 408 has electrical wiring 955 for contact with components disposed on transparent carrier 408 (for example, laser 904) and is in electrical communication with the solderable package 104 via direct electrical conductors 1104. The direct electrical connectors 1104 can be flip-chip contacts, conductive epoxy, solder balls, wire-bonds or other methods of creating electrical conduits. For an embodiment with a soldered connection, the direct electrical connector 1104 must be able to withstand the subsequent solder reflow assembly of the solderable package 104. An underfill 1108 can be provided between the transparent carrier 408 and the thermal interface region 920. The underfill 1108 can enhance the thermal path or enhance the mechanical stability of the thermal interface region 920.

Circuit elements 965 shown at the bottom of transparent carrier 408 can be ASICs/electrical components either mounted to the transparent carrier 408 or integrally formed "with" transparent carrier 408. Circuit elements 965 will be in electrical communication with electrical wiring 955 and/or with laser 904.

Figure 13:
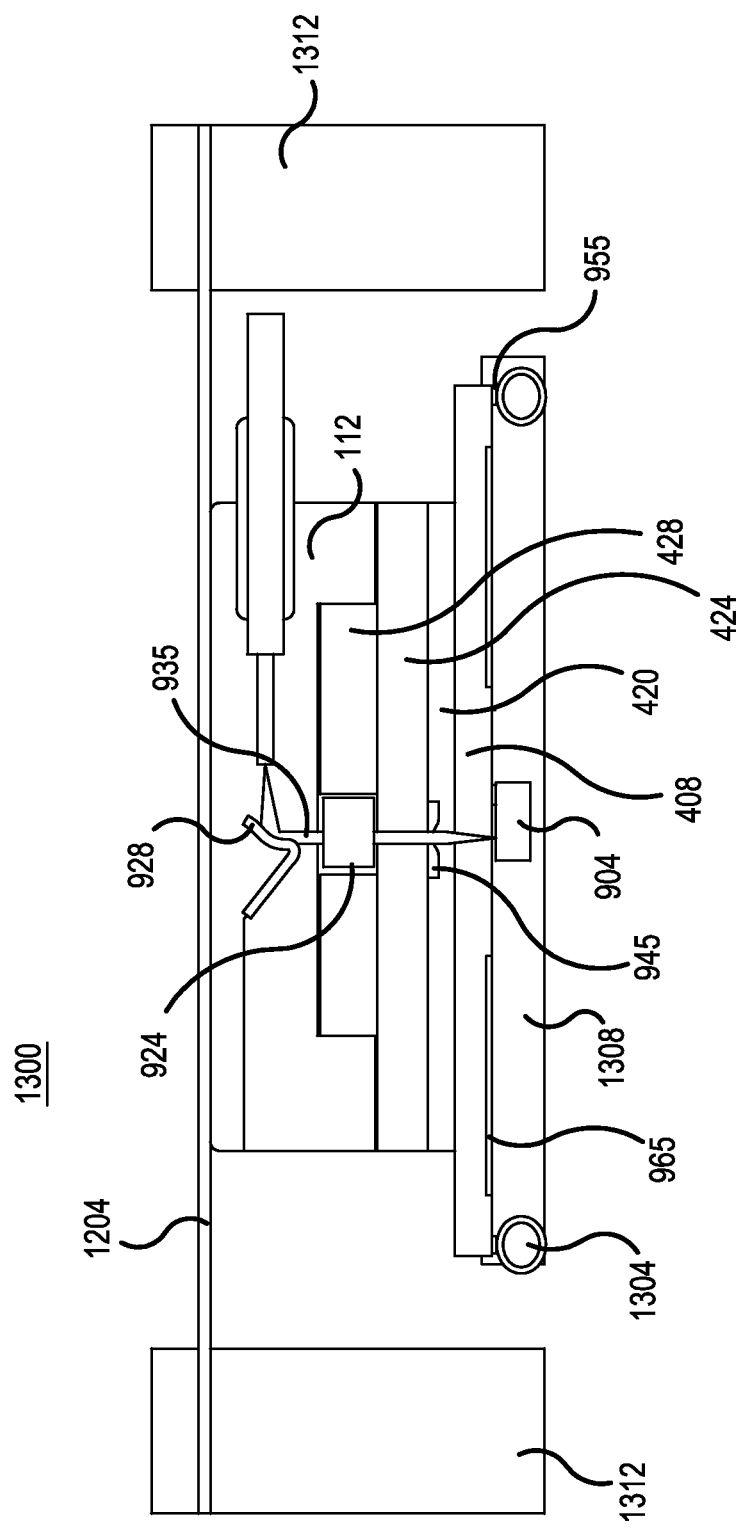
FIG. 13 is a side cut-away view of another embodiment of an interposerless packagable fiber optic transceiver mountable to a solderable package, with an attached fiber connector.

FIG. 13 is a side cut-away view 1300 of another embodiment of an interposerless packagable fiber optic transceiver mountable to a solderable package, with an attached fiber connector. This embodiment is very similar to the embodiment shown in FIG. 12, a significant difference being that the fiber connector 112 is held in place with connector retention 1204, which is in turn held to retention holder 1312 on a board (not shown). The retention holder 1312 is generally mounted in a direction generally perpendicular to the board, though other orientations may be implemented. This mounting can be performed with an adhesive, solder or mechanically press-fit or screwed into the board. The fiber optic connector 112 can have a coated corner turn lens 928 that processes light from a fiber to form a collimated beam 935. The collimated beam 935 may have an optical attenuator 924 in its path. The fiber optic connector 112 can be mated to a connector guide 428, which in turn is mounted to a lens seal 424, which in turn is mounted to a collimating lens 420, which in turn is mounted to a transparent carrier 408. Light from a laser 904 is further collimated by the collimating lens 420. The lens cavity 945 on the collimating lens 420 can be sealed with the lens seal 424. The sealing can be formed with adhesive bonding, solder bonding, ionic bonding or via a wafer processing method. The transparent carrier 408 has electrical wiring 955 and is in electrical communication via direct electrical connectors 1304 with a solderable package (not shown). The direct electrical connectors 1304 can be flip-chip contacts, conductive epoxy, solder balls, wire-bonds or other methods of creating electrical conduits. For an embodiment with a soldered connection, the direct electrical connector 1304 should to withstand the subsequent solder reflow assembly of the solderable package. An underfill 1308 can be provided between the transparent carrier 408 and the thermal interface region between the transparent carrier 408 and the solderable package. The underfill 1308 can enhance the thermal path or enhance the mechanical stability of the thermal interface region.

Circuit elements 965 shown at the bottom of transparent carrier 408 can be ASICs/electrical components either mounted to the transparent carrier 408 or integrally formed "with" transparent carrier 408. Circuit elements 965 will be in electrical communication with electrical wiring 955 and/or with laser 904.

Figure 14A:
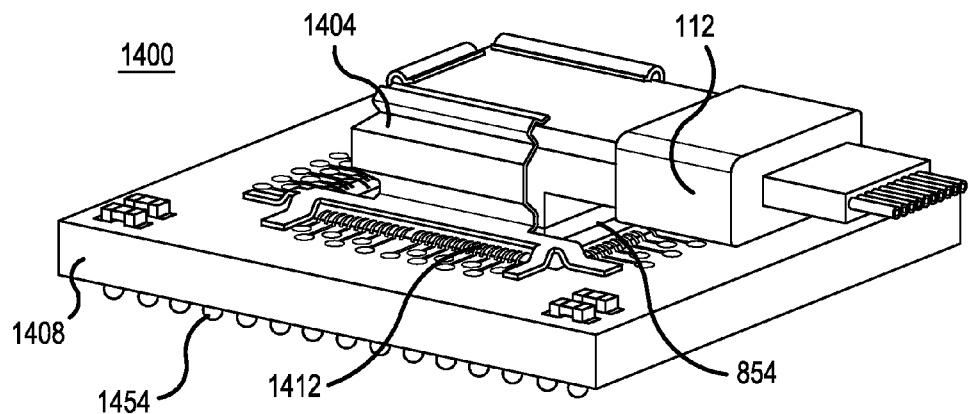
FIG. 14A is a perspective view of an embodiment of a fiber optic transceiver formed on a substrate.

FIG. 14A is a perspective view 1400 of an embodiment of a fiber optic transceiver formed on a substrate. The fiber connector 112 is mated to the optical transceiver 854 and held in place with a non-bar like connector retention 1404 that is secured to the substrate 1408. The connector retention 1404 can be configured to allow the fiber connector 112 to "clip-in" to the optical transceiver 854. The connector retention 1404 can be secured to the optical transceiver 854 with epoxy, mechanically press-fit, soldered, or other methods. Electrical conductors 1412 form electrical conduits between the optical transceiver 854 and the substrate 1408. The substrate 1408 is configured with electrical contacts on the upper side 1412 for electrical contact with the optical transceiver 854 and electrical contacts on the lower side 1454 for electrical contact with a higher level board.

Figure 14B:
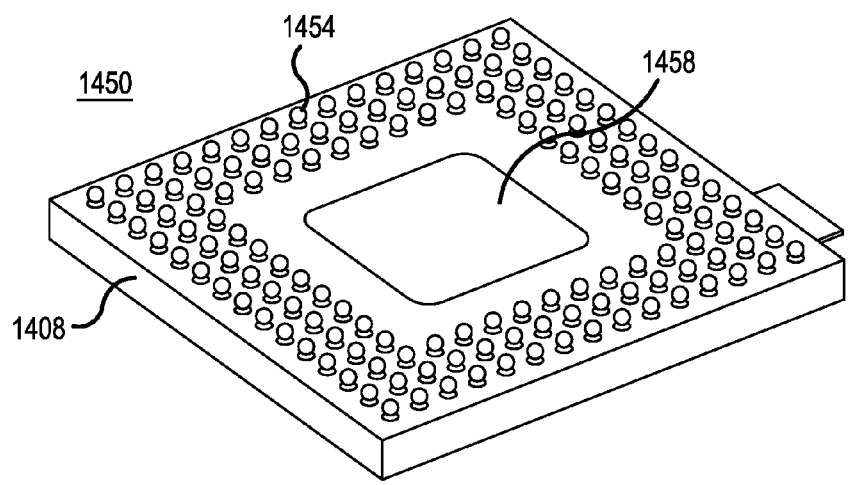
FIG. 14B is a bottom view of the embodiment of FIG. 14A.

FIG. 14B is a bottom view 1450 of the embodiment of FIG. 14A. The substrate 1408 with electrical contact on two sides can have an array of electrical contacts 1454 and a thermal contact region 1458. The array of electrical contacts 1454 can be ball grid arrays (BGA), column grid arrays (CGA), land grid arrays (LGA) or other electrical contact technology used in PCB assembly. The embodiment of FIGS. 14A-B enable a transceiver assembly to be easily mounted to a higher level board, via the electrical contacts 1454 and also easily attached to a fiber optic connector 112. Depending on the implementation, the substrate 1408 can be an interposer board.

It will be understood that many additional changes in the details, materials, steps and arrangement of parts, which have been herein described and illustrated to explain the nature of the invention, may be made by those skilled in the art within the principle and scope of the invention as expressed in the appended claims.

What is claimed is:

1. A solderable fiber optic transceiver device, comprising:
   a connector guide, a top portion having an alignment guide hole configured to mate to an alignment pin of an attachable fiber optic connector and an optical port for light passage to/from an optical fiber in the attachable fiber optic connector;
   a lens seal coupled to a bottom portion of the connector guide;
   a collimating lens in alignment with the optical port and sealed to a bottom portion of the lens seal to prevent external contamination from gases and liquids;
   a transparent carrier coupled to a bottom portion of the collimating lens, wherein the transparent carrier has a first electrical wiring, and a second electrical wiring for connection to a higher level substrate; and
   an optoelectronic device in alignment with the collimating lens and mounted to an underside of the transparent carrier and connected to the first electrical wiring.

2. The device of claim 1, further comprising:
   at least one of an electrical circuit and an application specific integrated circuit (ASIC) attached to the second electrical wiring of the transparent carrier.

3. The device of claim 2, wherein at least one of the transparent carrier and application specific circuit (ASIC) is configured for mounting to a higher level substrate via at least one of a Ball Grid Array (BGA), Column Grid Array (CGA), Bump Chip Carrier (BCC) configuration, Leaded Chip Carrier (LCC) configuration, Plastic Leaded Chip Carrier (PLCC) configuration, Quad-Flat No-Lead (QFN) configuration, flip-chip contact, conductive epoxy, solder ball, wire-bond and metal posts with solder caps.

4. The device of claim 3, further comprising:
   a higher level substrate connected to at least one of the second electrical wiring and ASIC, wherein the higher level substrate is at least one of a printed circuit board (PCB) and circuit card; and
   a thermal interface region between the transparent carrier and the higher level substrate.

5. The device of claim 3, further comprising a fiber optic connector attached to the connector guide.

6. The device of claim 5, wherein the fiber optic connector comprises:
   a connector lens with a corner turn lens to re-direct light from a fiber, fiber mounts, and a strain relief capture cavity;
   a fiber cable containing a plurality of fibers coupled to the connector lens;
   a strain relief attached to the plurality of fibers and coupled to the connector lens; and
   a lens cap with a retention support feature for alignment, the lens cap coupled to the strain relief and connector lens.

7. The device of claim 6, wherein a bottom portion of the connector lens further comprises a slip joint alignment feature configured to assist in alignment with the connector guide and an optical gasket coupled to the bottom portion of the connector lens.

8. The device of claim 6, further comprising a connector retention coupled to the retention support feature and to a connector retention mount, wherein the connector retention mount is integral to a higher level substrate or coupled to a support frame of the higher level substrate.

9. The device of claim 1, further comprising:
   an interposer, a top portion connected to the second electrical wiring and a bottom portion having electrical contacts configured for mounting to a higher level substrate via at least one of a Ball Grid Array (BGA), Column Grid Array (CGA), Bump Chip Carrier (BCC) configuration, Leaded Chip Carrier (LCC) configuration, Plastic Leaded Chip Carrier (PLCC) configuration, Quad-Flat No-Lead (QFN) configuration, Chip Scale Packaging (CSP), flip-chip contact, conductive epoxy, solder ball, wire-bond and metal posts with solder caps; and
   an interface region at a bottom portion of the interposer.

10. The device of claim 9, further comprising a higher level substrate connected to the electrical contacts of the interposer, wherein the higher level substrate is at least one of a printed circuit board (PCB) and circuit card.

11. The device of claim 9, further comprising a fiber optic connector attached to the connector guide.

12. The device of claim 11, wherein the fiber optic connector comprises:
    a connector lens with a corner turn lens to re-direct light from a fiber, fiber mounts, and a strain relief capture cavity;
    a fiber cable containing a plurality of fibers coupled to the connector lens;
    a strain relief attached to the plurality of fibers and coupled to the connector lens; and
    a lens cap with a retention support feature for alignment, the lens cap coupled to the strain relief and connector lens.

13. The device of claim 1, wherein the optoelectronic device is a laser and is flip-chip mounted to the first electrical wiring of the transparent carrier.

14. The device of claim 1, wherein at least one of the collimating lens and lens seal have a pocket to contain a bonding material.

15. A method for fabricating a solderable optical transceiver device, comprising:
    at least one of a wafer and flip-chip bonding a connector guide to a lens seal;
    at least one of a wafer and flip-chip bonding the lens seal to a collimating lens;
    at least one of a wafer and flip-chip bonding the collimating lens to a top side of a transparent substrate;
    at least one of a wafer and flip-chip bonding an optoelectronic device to a bottom side of the transparent substrate;
    populating a substrate with at least one of a passive electrical component, lead frame interconnect and a mechanical structure for supporting a lid;
    at least one of wire-bonding, ribbon-bonding, and flip-chip attaching an optical Core to the substrate; and
    sealing the device with at least one of a protective cover and optically transparent sealing compound.

16. The method of claim 15, further comprising dicing out the bonded connector guide, lens seal, collimating lens, and transparent substrate.

17. The method of claim 15, further mounting the device to a higher level substrate via at least one of a Ball Grid Array (BGA), Column Grid Array (CGA), Bump Chip Carrier (BCC) configuration, Leaded Chip Carrier (LCC) configuration, Plastic Leaded Chip Carrier (PLCC) configuration, Quad-Flat No-Lead (QFN) configuration, flip-chip contact, conductive epoxy, solder ball, wire-bond and metal posts with solder caps.

18. The method of claim 15, further comprising mounting the device to an interposer having electrical contacts configured for mounting to a higher level substrate via at least one of a Ball Grid Array (BGA), Column Grid Array (CGA), Bump Chip Carrier (BCC) configuration, Leaded Chip Carrier (LCC) configuration, Plastic Leaded Chip Carrier (PLCC) configuration, Quad-Flat No-Lead (QFN) configuration, Chip Scale Packaging (CSP), flip-chip contact, conductive epoxy, solder ball, wire-bond and metal posts with solder caps.

19. The method of claim 15, further comprising attaching a fiber connector to the connector guide and a connector retention to a retention support feature on the fiber connector and to a connector retention mount, wherein the connector retention mount is integral to a higher level substrate or coupled to a support frame of the higher level substrate.

20. The method of claim 15, wherein the bonding process for the collimating lens to the top side of a transparent substrate includes forming registration marks to permit alignment of the optoelectronic device when bonded to the bottom side of the transparent substrate.

* * * * *